United States Patent [19]
Giersberg

[11] 4,232,188
[45] Nov. 4, 1980

[54] CIRCUIT ARRANGEMENT FOR RECEIVING SIMPLEX AND DUPLEX CURRENT TELEGRAPH CHARACTERS

[75] Inventor: Dieter Giersberg, Feldkirchen-Westerham, Fed. Rep. of Germany

[73] Assignee: Siemens Aktiengesellschaft, Berlin & Munich, Fed. Rep. of Germany

[21] Appl. No.: 12,349

[22] Filed: Feb. 15, 1979

[30] Foreign Application Priority Data

Feb. 17, 1978 [DE] Fed. Rep. of Germany ....... 2806884

[51] Int. Cl.$^3$ .............................................. H04L 5/14
[52] U.S. Cl. ..................................................... 370/24
[58] Field of Search ...................... 178/58 R, 58 A, 61, 178/68, 70 R, 70 TS, 71, 73, 88; 325/21, 22

[56] References Cited
U.S. PATENT DOCUMENTS

| | | | |
|---|---|---|---|
| 3,843,834 | 10/1974 | Burke | 178/58 A |
| 3,999,013 | 12/1976 | Reed et al. | 178/58 A |
| 4,024,501 | 5/1977 | Herring et al. | 178/58 A |
| 4,032,911 | 6/1977 | Melvin, Jr. | 178/58 A |

FOREIGN PATENT DOCUMENTS

2423463 8/1976 Fed. Rep. of Germany .

*Primary Examiner*—Thomas A. Robinson
*Attorney, Agent, or Firm*—Hill, Van Santen, Steadman, Chiara & Simpson

[57] ABSTRACT

A circuit arrangement for receiving simplex current and duplex current telegraph characters utilizes a series resistance in each of a plurality of telegraph lines. An operational amplifier is connected via switches to read the voltage drop across the line resistances and to signal such line conditions to an output circuit. The output circuit comprises a first differentiating circuit which passes the line conditions onto a bistable flip-flop, a monostable flip-flop operated by the first differentiating circuit to provide a timed trigger to a second differentiating circuit which triggers the bistable flip-flop into a condition indicative of the condition of the telegraph line being read.

11 Claims, 5 Drawing Figures

CIRCUIT ARRANGEMENT FOR RECEIVING SIMPLEX AND DUPLEX CURRENT TELEGRAPH CHARACTERS

BACKGROUND OF THE INVENTION

1. Field of the Invention

The present invention relates to a circuit arrangement for receiving telegraphic characters, and more particularly to such an arrangement which may be used for simplex operation and duplex operation.

2. Description of the Prior Art

Receiver circuits for telegraph characters generally evaluate the current flowing over the telegraph lines with the aid of relays. For the operation of such receiver circuits, line build-up network impedances are required, and for operation in the simplex mode, balancing impedances are required whose values are dependent upon the individual properties of the telegraph current circuits. Therefore, as a rule, changes in line properties require a new adjustment of the receiver circuit. This is considered a disadvantage, above all, when a receiver circuit is required which can be connected to a plurality of lines. As an example, reference is made to the connection to a monitoring installation. Such installations are utilized in telegraphy, above all, for the purpose of monitoring subscriber lines or junction lines.

SUMMARY OF THE INVENTION

The object of the present invention is to provide a receiver circuit for receiving telegraph characters which can be connected to lines which are operated in simplex, as well as lines which are operated in duplex, in a simple fashion; e.g. subsequently, wherein no transfer between simplex operation and duplex operation is necessary and which is independent, within wide limits, of the magnitude of the telegraph current.

This object is achieved, in that, in at least one wire of a telegraph line, a resistance is provided through which line current flows, and at least one amplifier element having a threshold value behavior is provided in an input circuit which is connectible to the line. The amplifier element evaluates the voltage drop across the resistance and signals the line connection so detected to an output circuit. The output circuit contains a first differentiating circuit and a second differentiating circuit. The first differentiating circuit is operable in response to the amplifier elements of the input circuit. The second differentiating circuit is operable by way of a monostable flip-flop from the output of the first differentiating circuit. A bistable flip-flop is operated from the output of the first differentiating circuit and from the output of the second differentiating circuit. The monostable flip-flop, in the case of every increasing and decreasing slope of a character occurring on the line, and the bistable flip-flop, with every decreasing slope of the pulse emitted by the monostable flip-flop, can be set into the position corresponding to the condition prevailing on the telegraph line.

A significant advantage of a circuit arrangement constructed in accordance with the present invention is that the circuit reacts at low voltage drops, and can therefore be connected to very low-impedances in the telegraph lines; for example, to measuring resistances. Therefore, it is an advantage that the receiver circuit can be connected by way of a multiwire subscriber line and by way of presently known test edgeboard connectors of a transmission set or a line terminating set. The utilization of a switching installation makes it possible that, in an advantageous manner, the receiver circuit can be selectively connected to different transmitting and receiving lines, respectively. After a completed connection, no further operation is required. The receiver circuit constructed in accordance with the present invention additionally guarantees that the distortions caused by transients are eliminated.

In a particular embodiment of the invention, the amplifier elements provided for the purpose of amplifying the voltage drops at the resistances are operational amplifiers having an individual electrically-separated current supply.

Through the introduction of additional differentiating circuits at the input of the operational amplifiers, and through the utilization of an integrating element connected in parallel to the degenerative feedback resistors of the operational amplifiers, a reduction of the inherent distortion is achieved, on the one hand, and a reduction of the sensitivity to negative disturbance pulses at the input of the operational amplifiers is achieved, on the other hand.

According to a further embodiment of the invention, the flip time of the monostable flip-flop is adjustable to a value which delays the emission of a clock pulse for the bistable flip-flop by such a period of time that brief interference pulses at the input of the receiver circuit remain ineffective; i.e., the receiver circuit is insensitive to interference pulses at the input. Through the utilization of optical couplers as transmission elements between the amplifier elements and the first differentiating circuit, an electrical separation between these parts is achieved. It is possible to connect at the output side of the receiver circuit a control switching means, preferably an electronic relay, and a connection monitoring circuit. The system then functions as a monitoring installation by way of which the monitoring machine is connectible solely for the duration of the calling condition.

The actuation of the monitoring machine itself can proceed by way of an installed motor switching relay, by means of which, for example, the motor of a teleprinter can be switched on and off, via a mechanical remote switch, or via a remote control unit connected to the output of the monitoring unit. This provides the advantageous possibility of arranging the actual monitoring machine separately from the monitoring installation. In this case, the monitoring machine is connected with the monitoring installation via a line of which it is possible to selectively operate with local loop keying, with interrupt keying, or with double-current keying, and which is reversed in polarity corresponding to the call-connection condition or the idle condition.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
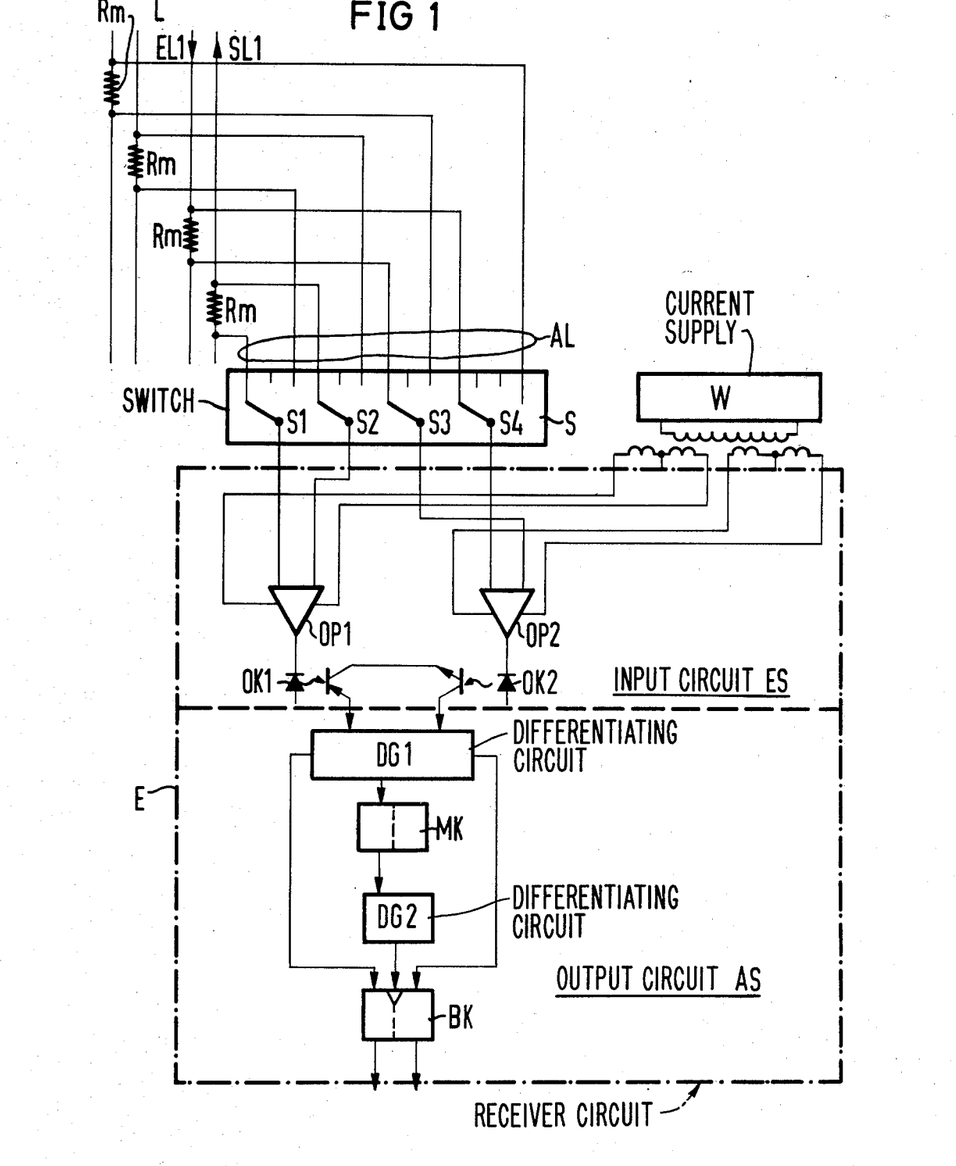
FIG. 1 is a schematic circuit representation of the construction of a receiver circuit constructed in accordance with the present invention.

The construction and method of operation of the circuit arrangement of the present invention will be explained in the following on the basis of FIG. 1. The receiver circuit E, illustrated in FIG. 1, comprises an input circuit ES and an output circuit AS and can be connected to telegraph lines L by way of a switching installation S which contains four switching arms S1–S4 in this particular illustration. Telegraph lines L can be subscriber lines or junction lines. By way of the switching installation S and a twelve-wire connection line AL, the receiver circuit E can be connected to a transmission line SL and a receiving line EL in such a manner that there is supplied to the inputs of the output circuit AS a voltage which, when current flows in the line SL and the receive line EL, provides voltage drops across the resistances Rm. In the example illustrated in FIG. 1, measuring resistances Rm serve this purpose. The voltage drop across the measuring resistance is supplied to the respective amplifier elements, which in this example are provided as operational amplifiers OP1 and OP2 within the input circuit ES which are respectively provided for the transmission direction and the receiving direction. The operational amplifiers OP1 and OP2 have a separate current supply W. A pair of optical couplers OK1 and OK2 are provided at the output of respective operational amplifiers OP1 and OP2. Dependent upon the stop polarity or the start polarity on the lines SL1 and EL1, the output transistors of the optical couplers OK1 and OK2 become conductive or blocked. A signal emitted in this manner from the input circuit ES is differentiated in a first differentiating circuit DG1 of the output circuit AS and is utilized as a trigger pulse for a monostable flip-flop MK. The flip time of the monostable flip-flop MK is adjustable and corresponds, in the example considered here, to half the pulse length of the characters transmitted over the telegraph lines SL1 and EL1. A second differentiating circuit DG2 is connected to the output of the monostable flip-flop MK and produces a trigger pulse for a bistable flip-flop BK when the monostable flip-flop returns to its stable condition subsequent to its flip. The information corresponding to a stop polarity character element or a start polarity character element is, therefore, in each instance transferred from the first differentiating circuit G1 into the bistable flip-flop BK. It is thereby achieved that each polarity reversal on the telegraph line being monitored in the transmission direction and in the receiving direction, in the example under consideration, is transferred, delayed by one half pulse length, from the input of the receiver circuit E into the bistable flip-flop BK. Distortions which occur due to transient phenomena, above all, on simplex lines are therefore eliminated. The adaptation of the system to different telegraph speeds can be achieved in a simple manner by changing the flip time of the monostable flip-flop MK.

Figure 2:
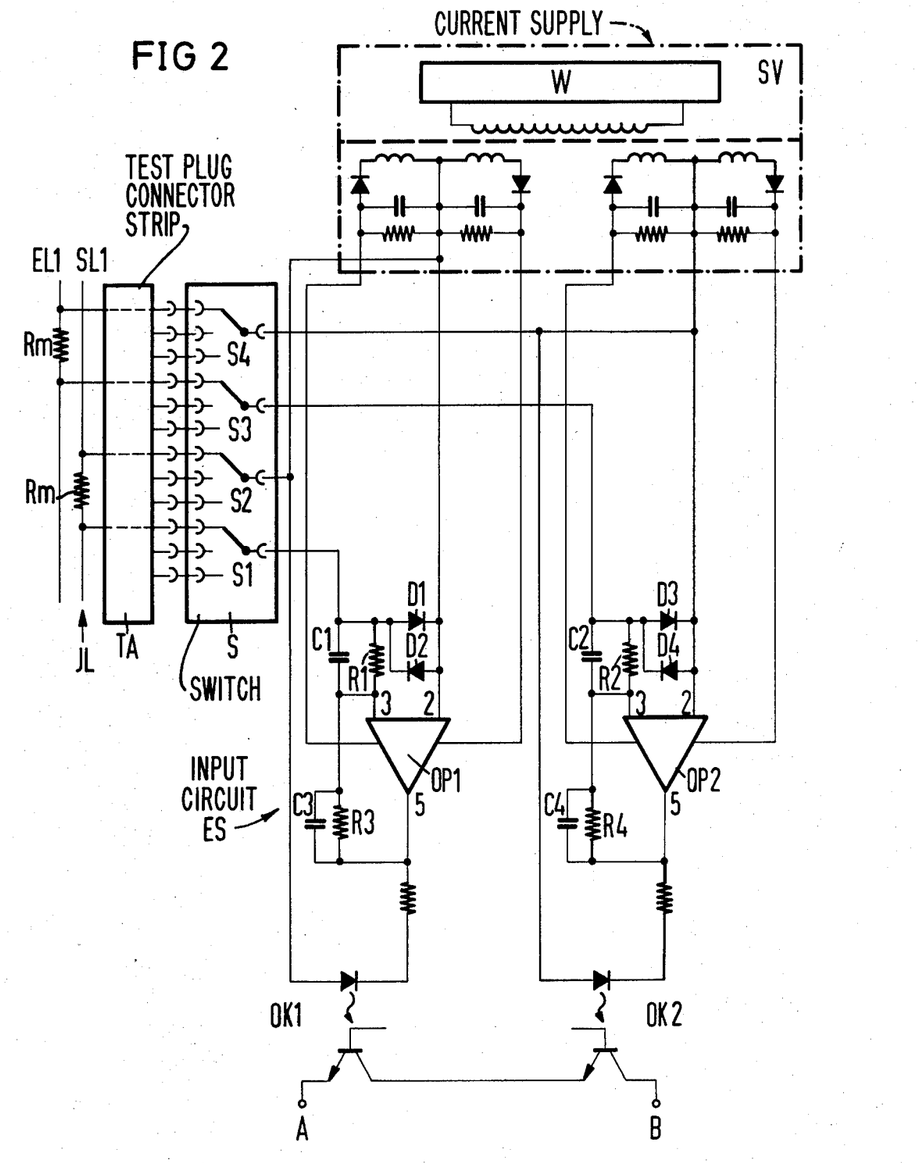
FIG. 2 is a schematic circuit diagram of the input circuit of the receiver circuit illustrated in FIG. 1.

The construction of the input circuit ES and its connection to a telegraph line is illustrated in FIG. 2. The connection is established by way of the previously-described switching installation S with the switching arms S1–S4, here connected by way of a plug connection to the test plug connector strip TA of the transmission line or subscriber line set and, by way of the latter, is in turn connected to the measuring resistances Rm in the transmission line SL1 and in the receiving line EL1. The current supply SV for the operational amplifier OP1 and OP2 in the input circuit ES, arranged in the upper part of FIG. 2, and which may be constructed in a manner that is well known per se, contains essentially a transformer W and additional circuit elements which are not further described herein. The voltage drop at the resistance Rm disposed in the transmission line SL1 is, in the example of FIG. 2, supplied by way of the switching arms S1 and S2 to the non-inverting input 2 of the operational amplifier OP1, on the one hand, and via a RC network, to the inverting input 3 of the operational amplifier OP1, on the other hand. At the non-inverting input 2 of the operational amplifier OP1, the zero potential of the supply voltage is also connected. A reference voltage is therefore set at the connection point of a resistor R1 and a capacitor C1 which is always positive if a stop-polarity current flows through the resistance Rm; which is always negative if a start-polarity current flows through the resistance RM; and which is 0 volt when, in the case of simplex operation, the start-polarity condition occurs on the telegraph line and the latter is therefore without current. A positive reference voltage at the connection point of the capacitor C1 and the resistor R1 effects the occurrence of an amplified negative voltage at the output 5 of the operational amplifier OP1. A current therefore flows through the diode of the optical coupler OK1 which is effective to render the output transistor conductive. If the reference voltage at the connection point of the capacitor C1 and the resistor R1 is negative, 0 volt is likewise applied to the output 5 of the operational amplifier OP1, and the output transistor of the optical coupler OK1 remains blocked. The described operations apply in the manner with respect to the operational amplifier OP2 to which the voltage drop at the resistance Rm in the receiving line EL1 is supplied by way of the switching arms S3 and S4. In this case, the optical coupler OK2 is operated in such a manner that its output transistor, in the case of stop-polarity pulses on a receiving line EL1 is conductive, and, in the case of start-polarity pulses on the receiving line EL1, is blocked. The serially-connected capacitors at the inputs of the operational amplifier OP1 and OP2 act as differentiating circuits which make it possible, even in the case of strongly slurred pulse slopes, to recognize the pulse starts sufficiently early that virtually no inherent distortion results. The capacitors C3 and C4, which are connected in parallel with respective degenerative feedback resistors R3 and R4, function as integrated circuits which cause a reduction in sensitivity of the operational amplifiers OP1 and OP2 relative to the negative interference pulses at the input of the input circuit ES. A pair of diodes D1 and D2 limit the input voltage for the operational amplifier OP1, while another pair of diodes D3 and D4 serve the same purpose with respect to the operational amplifier OP2. The output signals of the optical couplers OK1 and OK2 are available at respective points A and B.

Figure 3:
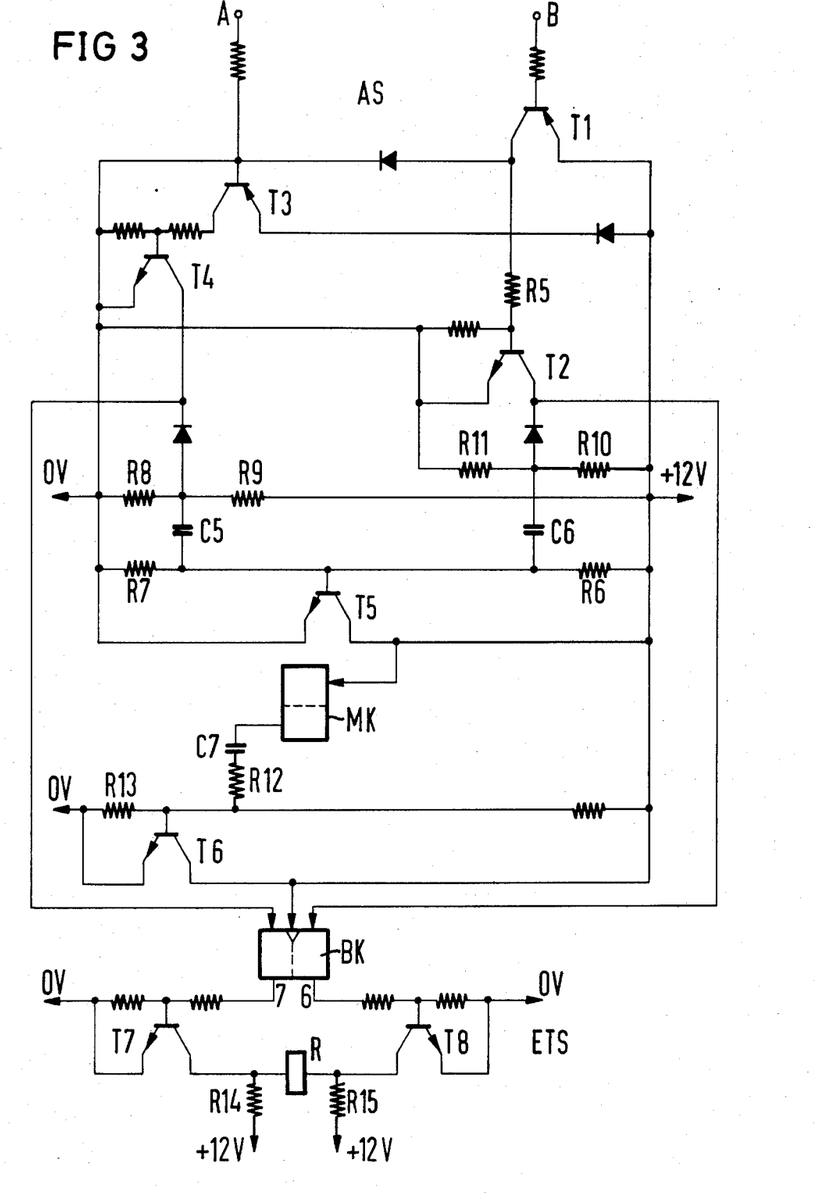
FIG. 3 is a schematic circuit diagram of the output circuit of the receiver circuit illustrated in FIG. 1.
Figure 5:
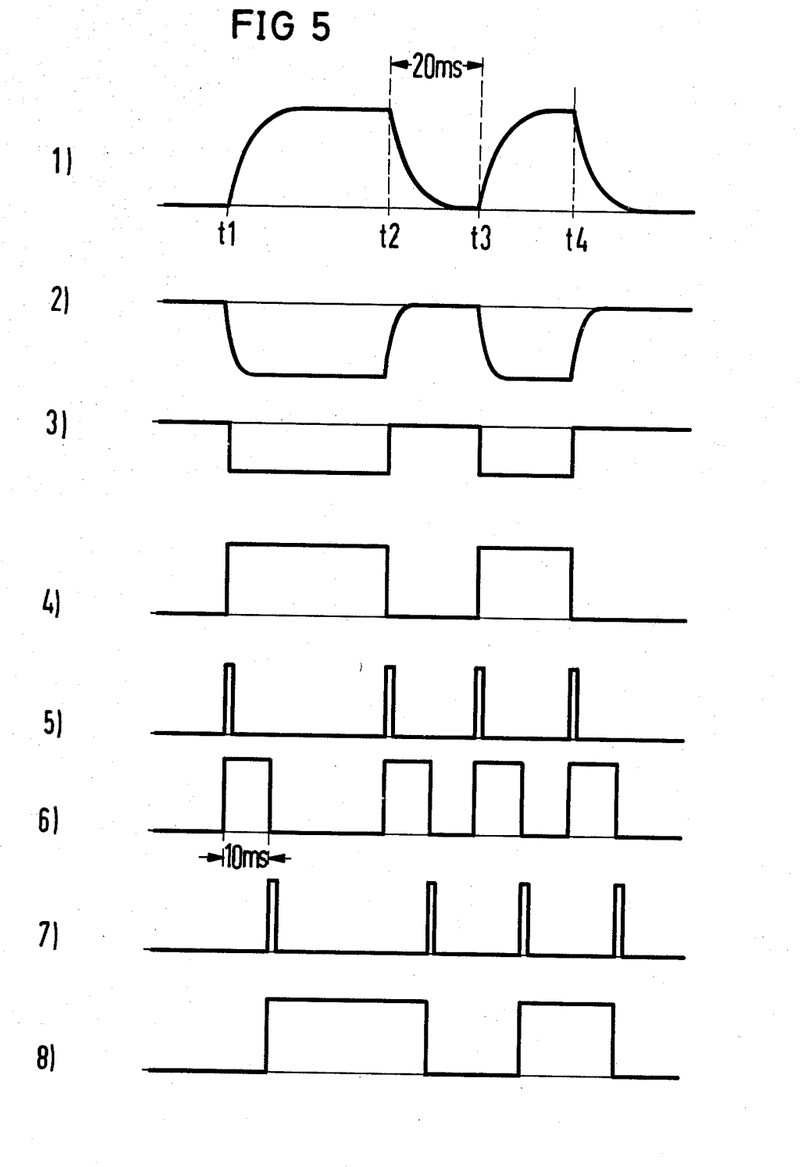
FIG. 5 is a voltage and pulse diagram related to several selected circuit points of the circuits illustrated in FIGS. 2, 3 and 4.

FIG. 3 illustrates the construction of the output circuit AS. In the description of the method of operation, reference is simultaneously made to the voltage and pulse diagram for simplex operation illustrated in FIG. 5. The condition of the circuit will be first described which exists on the telegraph lines during an idle condition. This is characterized by the start polarity on the transmission line as well as on the receiving line. As has been explained on the basis of FIG. 2, the output transistors of the optical couplers OK1 and OK2 are blocked. In the output circuit AS, a pair of transistors T1 and T2 are therefore blocked by way of the circuit points A and B, whereas a pair of transistors T3 and T4, and an additional transistor T5, are conductive. The bistable flip-flop BK is in a condition which characterizes the start-polarity condition on the telegraph line. A capacitor C5 is charged to the voltage value determined by the voltage divider which comprises a pair of resistors R6 and R7, via the conductive transistor T4. As a consequence of the blocked transistor T2, the capacitor C6 is charged to a voltage value determined by the voltage divider circuits which comprise the resistors R6 and R7 as well as the resistors R10 and R11.

After a connection is established, the transmitting and receiving lines assume the stop-polarity condition. This is seen at the time t1 in line 1 of FIG. 5. As was described earlier with respect to FIG. 2, the outputs of both operational amplifiers OP1 and OP2 emit a negative voltage which is indicated on line 2 of FIG. 5, and the output transistors of the two optical couplers OK1 and OK2 are operated so as to be conductive, as indicated in line 3 of FIG. 5. The transistor T1 in the output circuit AS is thereby rendered conductive by way of the circuit point B. The transistor T2 now also becomes conductive by way of the resistor R5. The transistors T3 and T4 are blocked. By way of the conductive transistor T2, the capacitor C6 is now connected to 0 volt and undergoes a charge reversal. During this charge reversal, the transistor T5 is briefly blocked by way of the voltage divider having the resistors R6 and R7 and emits a positive circuisitive trigger pulse. The input of the monostable flip-flop MK is indicated in line 4 of FIG. 5. Simultaneously, the capacitor C5 is again charged by way of the voltage divider resistors R8 and R9, or R6 and R7, respectively. The circuit portion described in the foregoing corresponds to the previously-mentioned differentiating circuit DG1. The monostable flip-flop MK, subsequent to release by the trigger pulse, emits a rectangular pulse of adjustable length. The length of the rectangular pulse is dependent upon the telegraph speed and can for example be adjusted to a telegraph speed of 50 Bd, 75 Bd or 100 Bd. In the exemplary embodiment now discussed, the length of the rectangular pulse amounts to 10 ms, as indicated in line 6 of FIG. 5. By way of the differentiating circuit DG2 which is connected to the output of the monostable flip-flop MK, the differentiating circuit DG2, which comprises a capacitor C7, a resistor R12, a transistor T6 and a resistor R13, a positive trigger pulse is produced with the negative slope of the rectangular pulse, and transmitted to the pulse input of the bistable flip-flop BK, as seen in line 7 of FIG. 5. As a consequence, the bistable flip-flop BK assumes the switching condition of the transistors T2 or T4, respectively, which correspond to the polarity prevailing on the telegraph line. The bistable flip-flop BK is constructed in the form of a so-called master-slave flip-flop, so that there is available at its output 6 or its output 7, an output signal which corresponds to the character transmitted over the telegraph line, and which is delayed relative to the transmission of the character by half a pulse length. The evaluation of the output signal of the bistable flip-flop BK can then proceed by means of an electronic relay ETS. In the case under consideration, as a consequence of stop polarity existing on the telegraph line, the transistor T2 is conductive, so that the relay winding R of the electronic relay ETS is excited in a stop-polarity fashion by way of the output 6 of the bistable flip-flop BK over a path which includes a +12 volt supply, the resistor R14, the relay winding R, the transistor T8 and 0 volt supply, as indicated at line 8 of FIG. 5. With a reversal of polarity of the telegraph line from a stop polarity to a start polarity, as indicated at the time t2 in line 1 of FIG. 5, the voltage at the output of the operational amplifiers OP1 and OP2, as has been described on the basis of FIG. 2, drops to the value 0 volt, as indicated at line 2 of FIG. 5, which leads to blocking of the output transistors of the optical couplers OK1 and OK2 as indicated in line 3 of FIG. 5. The transistor T1 is thereby blocked by way of the circuit point B, as indicated in line 4 of FIG. 5, whereas the transistor T3 and T4 are rendered conductive. The capacitors C5 and C6 are thereby again brought into the charging condition, which corresponds to that on the telegraph line in the case of an idle condition. During the charge reversal of the capacitor C5, the transistor T5 is briefly blocked and again emits a positive trigger pulse, in the manner described, to the monostable flip-flop MK, as indicated in line 5 of FIG. 5. The rectangular pulse, as indicated at line 6 of FIG. 5, emitted by the monostable flip-flop MK, leads, in the manner also previously described, to the emission of a positive trigger pulse, as indicated on line 7 of FIG. 5, which is transmitted to the clock pulse input of the bistable flip-flop BK, and now sets the latter into the condition characterized by the conductive transistor T4. By way of the output 7 of the bistable flip-flop BK, the relay winding R of the electronic relay ETS is energized corresponding to the start polarity on the telegraph line, over a path which includes the +12 volt source, the resistor R15, the relay winding R, the transistor 7 and the 0 volt supply, as indicated also in line 5 of FIG. 5. These operations are repeated with each polarity reversal on the telegraph line. Therefore, every increasing and decreasing slope of a telegraph character (or single element) is differentiated and connected in the form of a trigger pulse to the input of the monostable flip-flop. The polarity of the input voltage is therefore transmitted to an electronic relay ETS with the delay of half a pulse length. The transients at the beginning of each character element which are brought about by line influences are eliminated.

Since the receiver circuit can be selectively connected to random telegraph circuits, and a connection or disconnection takes place free of interruption, as well as with no additional distortions occurring thereby, the receiver circuit can be utilized to great advantage in so-called monitoring installations. To this end, in an embodiment of the invention, a connection monitoring circuit is provided which is operable by way of the electronic relay ETS which is connected to the output of the bistable flip-flop BK. The connection monitoring circuit essentially has the job of recognizing and evaluating the call connection condition characterized by stop polarity conditions on both telegraph lines during a predetermined period, and recognizing and evaluating the release condition characterized by a start-polarity condition on both telegraph lines during a predetermined second period. By way of additional control switching means it is therefore possible, subsequent to recognition of the call-connection condition to reverse the polarity on a line leading to the monitoring machine, and to switch on the monitoring machine, or, subsequent to recognition of the release condition, to again establish the original condition; i.e. to again switch off the monitoring machine. During a call-connection condition, the character elements on the telegraph line under consideration are recorded in the monitoring machine. The connection monitoring circuit, to this end, contains essentially switching transistors and time-determining switching elements for an actuating time and a switching off time. A circuit suitable for use as a connection monitoring circuit is described, for example, in the German published application No. 2,438,470.

Figure 4:
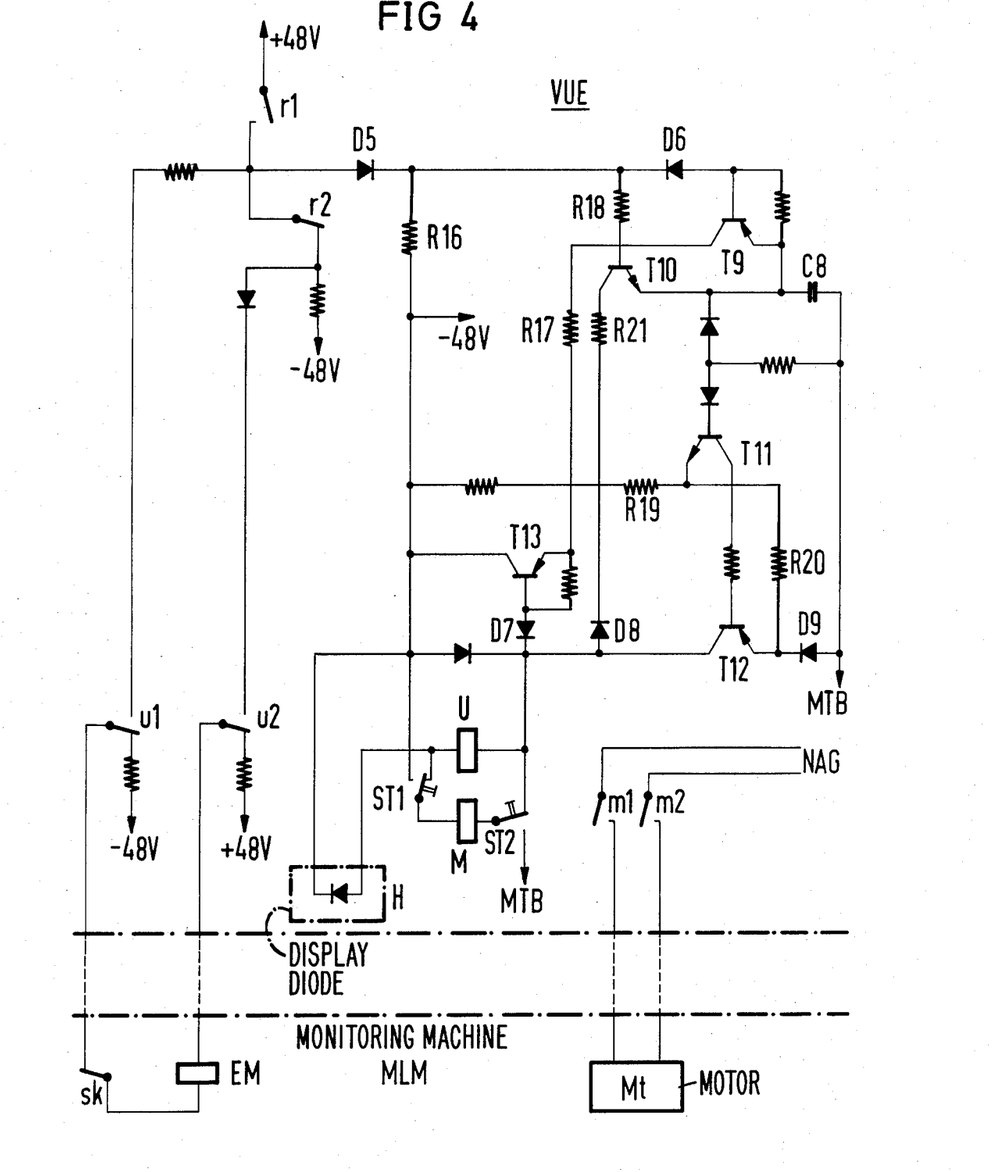
FIG. 4 is a schematic circuit diagram of the call supervision for monitoring circuit which may be employed in connection with the circuits of FIGS. 1-3 in practicing the present invention.

Details of this embodiment are described on the basis of an exemplary embodiment of the circuit arrangement illustrated in FIG. 4. In the idle condition, i.e. in the case of a start-polarity condition on at least one of the telegraph line, the contacts r1 and r2 of the electronic relay ETS are disposed corresponding to a start-polarity position of the bistable flip-flop BK in the position illustrated. In this case, the transistors T9 and T13 are conductive by way of a diode D6, and a capacitor C8 is charged over the circuit including the supply MTB, the capacitor C8, the transistor T9, the resistor R17, the transistor T13 and the −48 volt supply. The transistors T11 and T12 are blocked so that the voltage connected to the voltage divider point of the resistors R19 and R20 is more positive than the voltage connected to the capacitor C8. The control switching means, switchable by way of the transistor 12, in this example the relays U and M, are not energized in so that a polarity corresponding to the idle condition prevails on the line leading to the monitoring machine MLM by way of the relay contacts u1 and u2. With the occurrence of a stop-polarity pulse, by means of which the relay contacts r1 and r2 are reversed, the transistor T10 becomes conductive and the transistor T9 becomes blocked. For the capacitor C8 there now exists a charge reversal current circuit over the path including the supply MTB, the capacitor C8, the transistor T10, the resistor R18, the diode D5, the contact r1, and the +48 volt supply. The duration of this charge reversal is determined by the dimensioning of the resistor R18 and the capacitor C8, as well as by the dimensioning of the voltage divider which includes the resistors R19 and R20. This period of time is designated in the following as the response time. If the stop-polarity pulse is shorter than the response time, that is if a start-polarity pulse again occurs prior to the execution of the response time, the transistor T9 is again rendered conductive and the transistor T10 is blocked, so that the voltage at the capacitor C8 is reversed in charge prior to the arrival of the voltage value set at the divider point of the resistors R19 and R20. The capacitor C8 is therefore first connected into a low-resistance circuit and rapidly discharged and then charged again over the path including the main supply MTB, the capacitor C8, the transistor T9, the diode D6, the resistor R16 and the −48 volt supply. The transistors T11 and T12 remain in the blocked condition during these charge reversal operations.

A period of 65 ms is provided as the response time for the examplary embodiment discussed herein. With the arrival of a positive pulse which lasts longer than the response time, following the completion of the response time, the transistors T11 and T12 are rendered conductive, so that the transistors T13 and T9 are blocked by way of the diode D7. By way of the diode D8 and the resistor R21, the transistor 10 becomes conductive so that the capacitor C8, now with a very small time constant which is determined by the resistor R21 and the capacitor C8, is very rapidly discharged and subsequently charged over the path including the main source MTB, the capacitor C8, the transistor T10, the resistor R18, the diode D5, the contact r1 and the +48 volt supply. In a current branch leading by way of a display diode H, the relays U and M are switched on through a path which includes the main supply MTB, the diode D9, the transistor T12, the relay winding U, a switch ST2, the relay winding M, a switch ST1, the diode H and the −48 volt supply.

Through the transfer contacts u1 and u2, the line leading to the monitoring machine MLM is reversed in polarity, whereas, by way of the relay contacts m1 and m2, the current circuit for the motor Mt in the monitoring machine MLM is switched on. The transmission of the characters to the monitoring machine in the call-connection condition takes place by way of relay contact r2 of the electronic relay ETS. Subsequent to the establishment of the call-connection condition, the capacitor C8 is completely charged by way of the contact r1 over a path including the main supply MTB, the capacitor C8, the transistor T10, the resistor R18, the diode D5, the relay contact r1 and the +48 volt supply. If during the call-connection condition, start-polarity characters arrive, then, as was described above, the contacts r1 and r2 of the electronic relay ETS are reversed, which means that the capacitor C8 is rapidly discharged by way of the conductive transistor T9, whereby the time constant for this discharge is determined by the value of the resistor R17 and the capacitor C8. Subsequent to the charge equalization, a charging current circuit exists for the capacitor C8, for which a time constant is valid which is determined by the value of the capacitor C8 and the resistor R16. If during this charge a stop-polarity pulse arrives, the charge at the capacitor C8 is smaller than the voltage existing at the divider point of the resistors R19 and R20, the transistors T11 and T12 are conductive and the relays U and M do not change their positions. In this case, the capacitor C8 is again very rapidly discharged. The time constant for this operation is determined by the resistor R16 and the capacitor C8, and determines the switch-off delay, that is it determines the connection time. During the normal call-connection condition, start-polarity pulses arrive which, in no case, are greater than this switch-off or disconnection time. During the call-connection condition, the relay contacts r1 and r2 are actuated in the rhythm of the telegraph characters transmitted on the telegraph line being monitored. By way of the relay contact r2, the line to the monitoring machine MLM is respectively interrupted, and, in the receiving magnet of the monitoring machine MLM, the transmitted character code elements are written. If a start-polarity pulse occurs, whose duration is greater than the mentioned disconnection time, the transistors T11 and T12 are blocked, as a consequence which the relays U and M drop and the light emitting diode H is extinguished. The transistors T9 and T13 become conductive so that the capacitor C8 is again very rapidly reversed in charge. Therefore, the full response time is again available. The connection monitoring circuit VUE is therefore again disposed in the initially-described idle condition.

In the exemplary embodiment illustrated in FIG. 4, in addition to the relay U effecting the charge reversal of the line, the relay M is provided for the purpose of switching the motor Mt on and off in the monitoring machine MLM. The two switches ST1 and ST2, as illustrated in FIG. 4, can also be constructed as switches by way of which one motor switch relay in the monitoring machine MLM is constantly energized when the load connected to the mains outlet NAG, for example, a remote control unit or a teleprinter having a mechanical remote switch has its own mains connection.

The control relay U reverses the polarity of the two-wire telegraph line to the monitoring machine MLM as in the case of a local subscriber connection. The possibility is therefore provided of switching on the monitoring machine MLM by way of a connection line and a remote control unit. As previously mentioned, the motor switch relay M can therefore be selectively connected from the monitoring unit MLM, or it can, in the case of actuated switches ST1 and ST2 be constantly switched on. The monitoring machine MLM, however, can also be operated with a mechanical remote switch. In this case, the transition from the idle condition to the call-connection condition effects a polarity reversal of the line and, hence, the motor connection of the monitoring machine MLM. In the exemplary embodiment, the point of departure was a response time of 65 ms and a disconnection time of 650 ms. Of course, with different telegraph speeds and different signaling regulations, other values may be utilized for the connection and disconnection time.

Although I have described my invention by reference to particular illustrative embodiments thereof, many changes and modifications of the invention may become apparent to those skilled in the art without departing from the spirit and scope of the invention. I therefore intend to include within the patent warranted hereon, all such changes and modifications as may reasonably and properly be included within the scope of my contribution to the art.

I claim:

1. A circuit arrangement for receiving single-current and double-current telegraph characters, comprising:
    telegraph line means for receiving telegraphic pulses;
    resistance means in said telegraph line means for carrying line current;
    an input circuit including amplifier means connected to evaluate the voltage drop across said resistance means; and
    an output circuit connected to said input circuit, including
        a first differentiating circuit operable in response to the output of said amplifier means to provide a first trigger signal,
        a monostable circuit connected to said first differentiating circuit and triggered thereby to provide a pulse of a predetermined length;
        a second differentiating circuit connected to said monostable circuit and operable to differentiate said pulse and provide a second trigger signal, and
        a bistable circuit connected to said second differentiating circuit and responsive to said second trigger signal to provide an output signal,
    whereby said monostable circuit, in response to each positive-going transition and each negative-going transition, and said bistable circuit in response to each negative-going transition from said monostable circuit provides the signal condition existing on the telegraph line means.

2. The circuit arrangement set forth in claim 1, wherein:
    said telegraph line means comprises a plurality of telegraph lines for receiving telegraphic pulses;
    said resistance means comprises a plurality of resistances each connected in series with a respective telegraph line;
    said amplifier means comprises a plurality of operational amplifiers, each of said operational amplifiers including
        an input,
        an output,
        a feedback resistance connecting said output and said input,
        a differentiating circuit connected to said input, and
        an integrating element connected in parallel with said feedback resistance;
    and further comprising switching means operable to selectively connect said inputs of said operational amplifiers across said resistances which are serially connected with said telegraph lines.

3. The circuit arrangement set forth in claim 2, comprising an electrically separate current supply connected to said operational amplifiers.

4. The circuit arrangement set forth in claim 1, wherein the flip time of said monostable circuit is half the pulse duration of a telegraphic character received on said telegraphic line means, and wherein:
    said bistable circuit comprises a pair of set inputs; and
    said first differentiating circuit comprises a pair of transistors connected to and operated by said amplifier means and connected to respective ones of said set inputs whereby said bistable circuit is operated to a stable state in response to said second trigger signal and in dependence on the conductive states of said transistors.

5. The circuit arrangement set forth in claim 1, and further comprising:
    light coupling means connecting said amplifier means to said first differentiating circuit.

6. The circuit arrangement set forth in claim 1, comprising:
    electronic relay means connected to said bistable circuit and operable to produce start and stop polarity pulses in accordance with the operating state of said bistable circuit.

7. The circuit arrangement set forth in claim 6, wherein said electronic relay means comprises:
    an electromagnetic relay having a plurality of relay contacts.

8. The circuit arrangement set forth in claim 7, and further comprising:
    a monitor circuit including
        timing means connected to and operated with time delays by said relay contacts, and
        control switching means connected to and operated by said timing means, including switch contacts, for signaling polarity reversal signals; and
    a monitor machine including a monitor relay connected to and operated by one of said relay contacts via at least one of said switch contacts, and a monitor motor connected to and operated by some of said switch contacts.

9. The circuit arrangement set forth in claim 8, and further comprising:

a switch in said control switching means connected in circuit with a voltage supply and operable to cause constant operation of said monitor motor.

10. The circuit arrangement set forth in claim 8, wherein said monitor machine is directly connected to said monitoring circuit.

11. The circuit arrangement set forth in claim 7, and further comprising:
a monitor circuit including
timing means connected to and operated with time delays by said relay contacts, and
control switching means connected to and operated by said timing means, including switch contacts, for signaling polarity reversal signals; and
monitor means including a monitor motor connected to and operated by some of said switch contacts, and a remotely located monitor relay connected to and operated by one of said relay contacts via at least one of said switch contacts.

* * * * *